US012389153B2

(12) United States Patent
Ding et al.

(10) Patent No.: US 12,389,153 B2
(45) Date of Patent: Aug. 12, 2025

(54) DRIVING CIRCUITS FOR PIEZOELECTRIC SPEAKERS

(71) Applicant: Google LLC, Mountain View, CA (US)

(72) Inventors: Yao Ding, San Jose, CA (US); Qi Qi, San Jose, CA (US)

(73) Assignee: Google LLC, Mountain View, CA (US)

(*) Notice: Subject to any disclaimer, the term of this patent is extended or adjusted under 35 U.S.C. 154(b) by 198 days.

(21) Appl. No.: 18/457,124

(22) Filed: Aug. 28, 2023

(65) Prior Publication Data
US 2023/0412961 A1 Dec. 21, 2023

Related U.S. Application Data

(60) Provisional application No. 63/578,910, filed on Aug. 25, 2023.

(51) Int. Cl.
H04R 1/10 (2006.01)
H04R 3/00 (2006.01)
H04R 17/00 (2006.01)

(52) U.S. Cl.
CPC ............. H04R 1/1025 (2013.01); H04R 3/00 (2013.01); H04R 17/00 (2013.01)

(58) Field of Classification Search
CPC ......... H04R 1/1025; H04R 3/00; H04R 17/00
See application file for complete search history.

(56) References Cited

U.S. PATENT DOCUMENTS 11,812,234 B1* 11/2023 Liang .................. H04R 3/00
2021/0175864 A1* 6/2021 Liang .................. H03F 3/2178

FOREIGN PATENT DOCUMENTS

CN 203659420 6/2014
CN 113781990 12/2021

OTHER PUBLICATIONS

"Interfacing a Piezo Buzzer with Stm32 Microcontroller", Retrieved at: https://www.engineersgarage.com/interfacing-buzzer-with-stm32-microcontroller/—on Jun. 7, 2023, 12 pages.

* cited by examiner

Primary Examiner — Andrew Sniezek
(74) Attorney, Agent, or Firm — Colby Nipper PLLC

(57) ABSTRACT

This document describes improved driving circuits for piezoelectric speakers (piezos). In aspects, a charging case for a hearable device includes a piezo and a circuit for driving the piezo having a battery, an inductor, first and second switches, and a microcontroller. The microcontroller is configured to first toggle the first switch for a number of times to charge the piezoelectric speaker via the inductor to a target voltage level and second toggle the second switch to discharge and thus sound the piezo. In such aspects, the first toggling of the first switch and the second toggling of the second switch control a volume and frequency, respectively, of the sounding, improving audio quality and providing finder features to users. Further, charging the piezoelectric speaker via the inductor enables the inductor to be smaller, conserving space within and power consumption of the charging case, leading to improved battery life.

9 Claims, 4 Drawing Sheets

DRIVING CIRCUITS FOR PIEZOELECTRIC SPEAKERS

CROSS-REFERENCE TO RELATED APPLICATION(S)

This application claims priority to U.S. Provisional Patent Application 63/578,910, filed on Aug. 25, 2023, which is incorporated herein by reference in its entirety.

SUMMARY

This document describes methods implemented by and systems utilizing an improved driving circuit for piezoelectric speakers (piezos). In aspects, a charging case for a hearable device includes a piezoelectric speaker and an improved circuit for driving the piezoelectric speaker. The improved circuit includes a ground plane, a direct-current (DC) voltage source, an inductor, a diode, first and second switches, and a microcontroller unit (MCU).

The DC voltage source includes a positive terminal that is connected to the inductor and a negative terminal that is connected to the ground plane. The first switch is connected between the inductor on a side opposite to the positive terminal of the DC voltage source and the ground plane. That is, the first switch is connected in parallel with the DC voltage source and the inductor. An anode of the diode is connected to the first switch and the inductor on the side opposite to the positive terminal of the DC voltage source.

In a first implementation, the second switch is connected between a cathode of the diode and the ground plane. The piezo is connected between the cathode of the diode and the ground plane. That is, in the first implementation, the piezoelectric speaker is connected in parallel with the second switch. In a second implementation, the second switch is connected to the cathode of the diode and the positive terminal of the DC voltage source. The piezoelectric speaker is connected between the cathode of the diode and the ground plane. That is, in the second implementation, the DC voltage source, the second switch, and the piezoelectric speaker are connected in series.

The MCU is configured to first toggle the first switch for a number of times to charge the piezoelectric speaker via the inductor to a target voltage level. By toggling the first switch to a closed position, the MCU configures the improved driving circuit as a closed loop including the DC voltage source, the inductor, and the first switch. In this configuration, energy from the DC voltage source is transferred and stored by the inductor. By toggling the first switch to an open position, the MCU configures the improved driving circuit as a closed loop including the DC voltage source, the inductor, the diode, and the piezoelectric speaker. In this configuration, the energy stored by the inductor is transferred and stored as a voltage across the piezoelectric speaker in a capacitive manner. The MCU continues to perform the first toggling of the first switch between the closed position and the open position for the number of times until the voltage across the piezoelectric speaker reaches the target voltage level.

The MCU is further configured to, responsive to first toggling the first switch for the number of times, second toggle the second switch to discharge and thus sound the piezoelectric speaker. In the first implementation described above, by toggling the second switch to a closed position while the first switch is in the open position, the MCU configures the improved driving circuit as a closed loop including the DC voltage source in series with the diode, the second switch in parallel with the piezoelectric speaker, and the ground plane. In this configuration, the voltage across the piezoelectric speaker is discharged into the ground plane and the piezoelectric speaker sounds. In the second implementation described above, by toggling the second switch to the closed position while the first switch is in the open position, the MCU configures the improved driving circuit as a closed loop including the DC voltage source in series with the piezoelectric speaker. In this configuration, the voltage across the piezoelectric speaker is discharged into the positive terminal of the DC voltage source and the piezoelectric speaker sounds.

In aspects, the improved driving circuit controls a volume of the piezoelectric speaker via the first toggling of the first switch and a frequency of the piezoelectric speaker via the second toggling of the second switch, which improves audio quality of the piezoelectric speaker. Further, by charging the piezoelectric speaker via first toggling the first switch to pulse the inductor, the improved driving circuit enables the inductor to be smaller, conserving space within and reducing power consumption of the charging case. In both the first and second implementations described above, reducing power consumption of the charging case may decrease a temperature of the charging case, which may be more comfortable for users. In the second implementation described above and realizing the DC voltage source as a battery, discharging the voltage across the piezoelectric speaker to the battery may increase battery life, which improves user experience.

This Summary is provided to introduce simplified concepts of improved driving circuits for piezoelectric speaker speakers, which are further described in the Detailed Description and are illustrated in the Drawings. This Summary is not intended to identify essential features of the claimed subject matter, nor is it intended for use in determining the scope of the claimed subject matter.

BRIEF DESCRIPTION OF THE DRAWINGS

The details of one or more aspects of foldable display support systems for thinner foldable devices and improved user experience are described in this document with reference to the following drawings.

DETAILED DESCRIPTION

Overview

Figure 1:
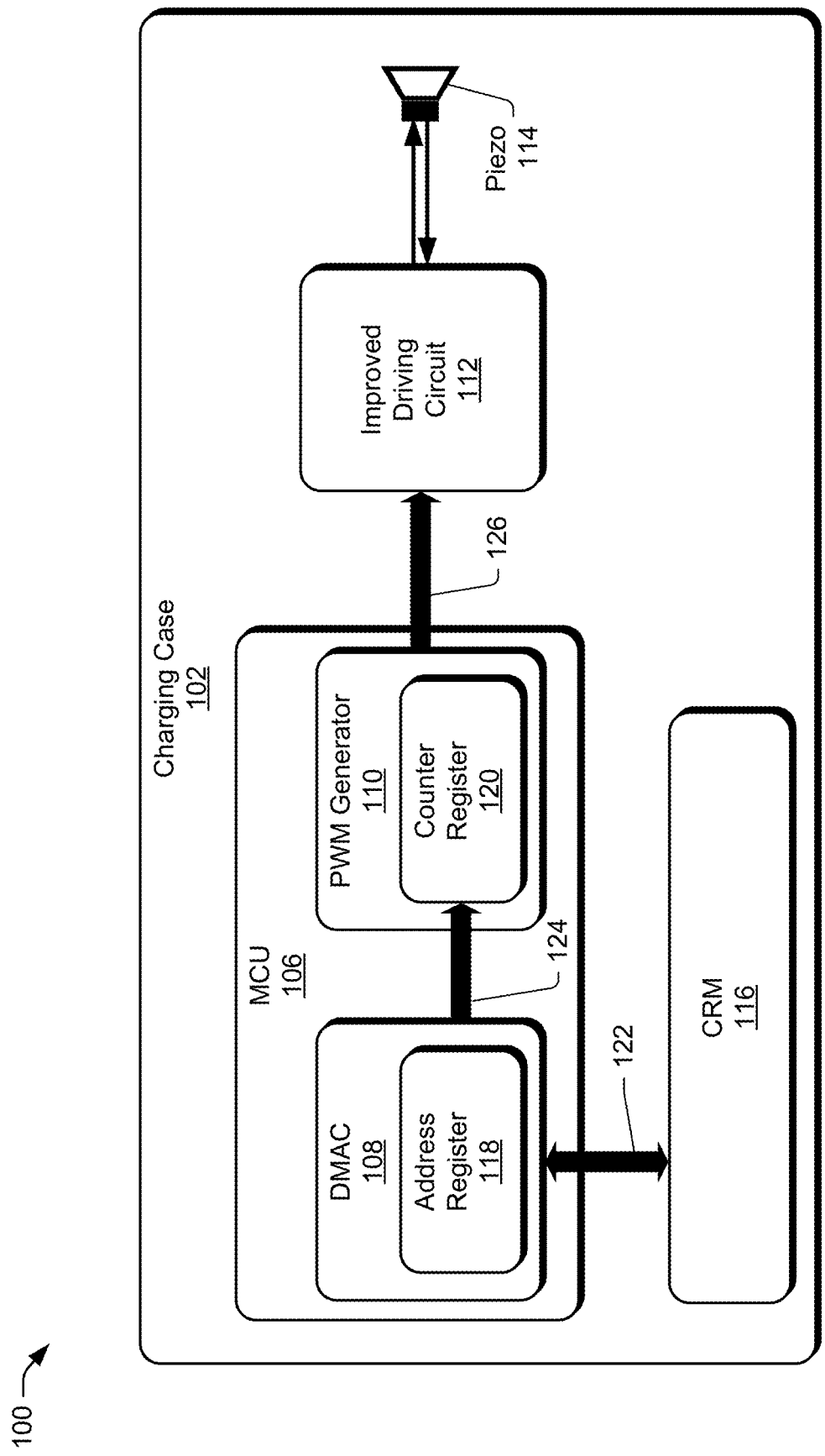
FIG. 1 illustrates an example implementation of a charging case for a hearable device that includes an improved driving circuit for a piezoelectric speaker.

Computing device users have become accustomed to a variety of features offered by a computing device. For example, smartphones users may have become accustomed to bright (e.g., 1,500 nits peak) and responsive (e.g., 90 hertz refresh rate) displays. Therefore, for smartphones to be competitive in a smartphone market, many smartphones include such displays. As another example, hearable device (e.g., headphones, earbuds) users may have become accustomed to high-fidelity audio (e.g., lossless), wireless capabilities, and long battery lives. Therefore, for a hearable devices to be competitive in a hearable device market, many hearable devices include such features.

Another example feature that hearable device users may have become accustomed to is a finder feature. That is, if a hearable device, especially a smaller hearable device such as wireless earbuds or an associated charging case, is misplaced (e.g., in between couch cushions) by a user, then the user may activate the finder feature (e.g., via an associated smartphone application, via a button press) to sound a piezoelectric speaker included in the hearable device. The user may then follow (e.g., by ear) the sound to recover the hearable device or the associated charging case.

In some implementations, however, a driving circuit for a piezoelectric speaker of a charging case may be designed in a suboptimal manner. As an example, the suboptimal driving circuit may operate in a clocked manner and utilize an inductor to charge the piezoelectric speaker prior. The inductor may be physically large to charge the piezoelectric speaker in fewer clock cycles and thus consume more power and physical space within the charging case. An increased power consumption and physical size may result in a poor user experience that includes a shorter battery life and less transportable configuration of the charging case.

As another example, a suboptimal driving circuit for a piezoelectric speaker of a charging case may lack features (e.g., MCUs, sound files, customization options) for improved audio quality. The suboptimal driving circuit may not include a customizable sound file so that the piezoelectric speaker sounds just one frequency, which users may perceive unpleasantly. Further, the suboptimal driving circuit may not include components configured for volume control of the piezoelectric speaker, which users may also perceive unpleasantly. In this example, lack of frequency and/or volume control may result in a poor user experience that includes an unpleasant tone and/or loudness of the piezoelectric speaker of the charging case. Further, both examples described above may influence users to avoid using finder features of a computing device (e.g., earphones, charging case, smartphone) when the computing device is misplaced.

Alternatively, this document describes methods implemented by and systems utilizing an improved driving circuit for piezoelectric speakers that alleviates the issues of increased physical size, decreased battery life, and/or degraded audio quality described above. In aspects, the improved circuit may be powered by a direct-current (DC) voltage source and controlled by a microcontroller unite (MCU) and include a ground plane (e.g., ground, earth), an inductor, a diode, and first and second switches.

The DC voltage source may be realized as any appropriate DC voltage source, including an alkaline battery, a nickel metal hydride battery, a lithium-ion battery, a power brick (e.g., for recharging the charging case), and so forth. The DC voltage source includes a positive terminal that is connected to the inductor and a negative terminal that is connected to the ground plane. The inductor may include an air core, an iron core, or a ferrite core, depending on design considerations of the improved driving circuit. Further, the inductor may be fixed, variable, pre-set, and so forth, depending on the design considerations. The inductor may be in a range from 1.02 millihenries (mH) to 1.38 mH.

The first switch is connected between the inductor on a side opposite to the positive terminal of the DC voltage source and the ground plane. That is, the first switch is connected in parallel with the DC voltage source and the inductor. The first switch can be any one of a variety of appropriate electronic switches, including silicon-controlled rectifiers (SCRs), triode alternating-current (TRIAC) switching devices (e.g., two back-to-back SCRs), bipolar junction transistors (BJTs), metal-oxide-semiconductor field-effect transistors (MOSFETs), and so forth. An anode (e.g., an entrance for conventional current) of the diode is connected to the first switch and the inductor on the side opposite to the positive terminal of the DC voltage source. The diode can be realized as a constant current diode, a Zener diode, a Schottky diode, a rectifier diode, a small signal diode, a P-N junction diode, and so forth. The diode is configured to block current in a reverse bias configuration and allow current in a forward bias configuration.

In a first implementation, the second switch is connected between a cathode of the diode and the ground plane. The second switch is like the first switch in that it can be realized as one of a variety of appropriate electronic switches. The piezoelectric speaker may be electrically capacitive and physically circular, of a diameter in a range from 10 millimeters (mm) to 50 mm Although a circular shape is mentioned, the piezoelectric speaker may be any appropriate shape, including square, rectangular, ovoidal, and the like. The piezoelectric speaker may be made of any one or more of a variety of materials, including ceramic, quartz, Berlinite (structurally identical to quartz), topaz, tourmaline, and so forth. The piezoelectric speaker is connected between the cathode (e.g., an exit for conventional current) of the diode and the ground plane. That is, in the first implementation, the piezoelectric speaker is connected in parallel with the second switch.

In a second implementation, the second switch is connected to the cathode of the diode and the positive terminal of the DC voltage source. The piezoelectric speaker is connected between the cathode of the diode and the ground plane. That is, in the second implementation, the DC voltage source, the second switch, and the piezoelectric speaker are connected in series and bypass the inductor and the diode.

The MCU may be realized as a synchronous system-on-a-chip (SOC) of one of a variety of dynamic (e.g., changing) or static (e.g., unchanging) clock rates, including five megahertz (MHz), 10 MHz, 13 MHz, and so forth. The SOC can be any single-core or multi-core processor that operates on a given instruction set (e.g., instruction set architecture) of multi-bit (e.g., four-bit, 16-bit, 64-bit) instructions, examples of which include a reduced instruction set computer (RISC) architecture, an advanced RISC machine (ARM) architecture, a microprocessor without interlocked pipe stages (MIPS) architecture, and so forth.

The MCU is operably coupled (e.g., electrically connected) to the first and second switches and configured to first toggle the first switch for a number of times (e.g., 1,000, 2,500) to charge the piezoelectric speaker via the inductor to a target voltage level (e.g., 5 volts (V), 10 V, 13 V, 32 V). By toggling the first switch to a closed position, the MCU configures the improved driving circuit as a closed loop including the DC voltage source, the inductor, and the first switch. In this configuration, energy from the DC voltage source is transferred to and stored in the inductor. By toggling the first switch to an open position, the MCU configures the improved driving circuit as a closed loop including the DC voltage source, the inductor, the diode, and the piezoelectric speaker. In this configuration, the energy stored in the inductor is transferred to and stored as a voltage in the piezoelectric speaker in a capacitive manner. The MCU continues to perform the first toggling of the first switch between the closed position and the open position for the number of times until the voltage across the piezoelectric speaker reaches the target voltage level.

The MCU is further configured to, responsive to first toggling the first switch for the number of times, second toggle the second switch to discharge and thus sound the piezoelectric speaker. In the first implementation described above, by toggling the second switch to a closed position while the first switch is in the open position, the MCU configures the improved driving circuit as a closed loop including the DC voltage source in series with the diode, the second switch in parallel with the piezoelectric speaker, and the ground plane. In this configuration, the voltage across the piezoelectric speaker is discharged into the ground plane and the piezoelectric speaker sounds. In the second implementation described above, by toggling the second switch to the closed position while the first switch is in the open position, the MCU configures the improved driving circuit as a closed loop including the DC voltage source in series with the piezoelectric speaker and bypassing the inductor and the diode. In this configuration, the voltage across the piezoelectric speaker is discharged into the positive terminal of the DC voltage source and the piezoelectric speaker sounds. In implementations where the DC voltage source is a battery, by so doing, the improved driving circuit may recover some energy from the piezoelectric speaker to the battery, improving battery life.

In aspects, the improved driving circuit controls a volume of the piezoelectric speaker via the first toggling of the first switch and a frequency of the piezoelectric speaker via the second toggling of the second switch, which improves audio quality of the piezoelectric speaker. Further, by charging the piezoelectric speaker via first toggling the first switch to pulse the inductor, the improved driving circuit enables the inductor to be smaller, conserving space within and reducing power consumption of the charging case. In both the first and second implementations described above, reducing power consumption of the charging case may decrease a temperature of the charging case, which may be more comfortable for users. In the second implementation described above and realizing the DC voltage source as a battery, reducing power consumption of the charging case may increase a battery life, which improves user experience.

Example Implementations

The following discussion describes example implementations, techniques, apparatuses that may be employed in the example implementations, and various devices in which components of improved driving circuits for piezoelectric speakers can be embodied. In the context of the present document, reference is made to the following by way of example only.

FIG. 1 illustrates an example implementation 100 of a charging case 102 for a hearable device (not illustrated) that includes an improved driving circuit 112 for a piezoelectric speaker 114 (piezo 114). The piezo 114 can be made of any one or more of a variety of materials, including ceramic, quartz, Berlinite (structurally identical to quartz), topaz, tourmaline, and so forth. Further, the piezo 114 can be any one of a variety of shapes, including circular, ovular, rectangular, and so forth. An effective radiation area of the piezo 114 may be in a range from 500 square millimeters ($mm^2$) to 900 $mm^2$ As an example, the piezo 114 may be circular in shape and include a diameter of 30 mm In this example, the piezo 114 would have an effective radiation area of approximately 707 $mm^2$.

As illustrated, the charging case 102 includes an MCU 106, the improved driving circuit 112, the piezo 114, and computer-readable media 116 (CRM 116). The MCU 106 includes a direct memory access controller 108 (DMAC 108) including an address register 118 and a pulse width modulation generator 110 (PWM generator 110) including a counter register 120. The DMAC 108 is operably coupled to the CRM 116 via a first interconnect 122 and to the counter register 120 of the PWM generator 110 via a second interconnect 124. Further, the PWM generator 110 of the MCU 106 is operably coupled to the improved driving circuit 112 via a third interconnect 126. The first interconnect 122, the second interconnect 124, and the third interconnect 126 may be referred to herein as "the interconnects 122-126."

The interconnects 122-126 may be any one or more appropriate single-bit or multi-bit buses. As an example, the interconnects 122-126 may be 16-bit buses configured to simultaneously transfer (e.g., between the DMAC 108 and the CRM 116, between the DMAC 108 and the counter register 120) 16 bits. As other examples, the interconnects 122-126 may be four-bit, eight-bit, 32-bit, 64-bit, or 128-bit buses configured to simultaneously transfer four bits, eight bits, 32 bits, 64 bits, or 128 bits, respectively. The interconnects 122-126 may transfer commands, addresses, data, or combinations thereof between operably coupled components.

The DMAC 108 may be any appropriate hardware device configured to facilitate communication between various input/output (I/O) devices and the CRM 116. The DMAC 108 may be realized as an integrated circuit (IC), an SOC, a printed circuit board (PCB), a motherboard, a daughterboard, or the like. Although not illustrated in FIG. 1, the DMAC 108 may include control logic configured to send and receive direct memory access (DMA) requests, DMA acknowledgements (e.g., from the CRM 116, from a processor), interrupts, read commands, write commands, and so forth.

The address register 118 of the DMAC 108 can include any one or more appropriate single-bit (e.g., one) or multi-bit (e.g., two, four, eight, 16, 32, 64, 128) registers. The address register 118 may be a type of memory used to accept, store, and transfer data and instructions. Various components, including flip-flops, latches, floating gate transistors, capacitors, and the like, may be included in the address register 118 for storing the data.

In the example implementation 100 of the charging case 102, the address register 118 is configured to store a sourcing address of a sound file that may be stored in the CRM 116. The sound file can include information defining a duration, volume (e.g., sound intensity), frequency (e.g., tone), audio quality, and any variations or combinations thereof that the piezo 114 may sound. The sound file may include data of sizes from eight bits (e.g., low-resolution audio quality) to 64 bits (e.g., high-resolution audio quality). The DMAC 108 and/or the address register 118 thereof may access the sound file from the CRM 116 using the first interconnect 122.

The DMAC 108 may transfer the sound file, or information thereof, to the counter register 120 of the PWM generator 110 via the second interconnect 124. The counter register 120 may step through the information of the sound file in step lengths that coincide with a defined audio quality included in the sound file. For example, if a low-resolution audio quality is defined (e.g., to save power, to save memory space), then the counter register 120 may step through the information of the sound file in eight-bit (e.g., one byte) increments. As another example, if a higher-resolution audio quality is defined (e.g., to improve a listening experience), then the counter register 120 may step through the information of the sound file in 16-bit (e.g., two bytes) increments. Based on the counter register 120, the PWM generator 110 may generate pulses (e.g., electrical signals) to send to the improved driving circuit 112 via the third interconnect 126.

Figure 2:
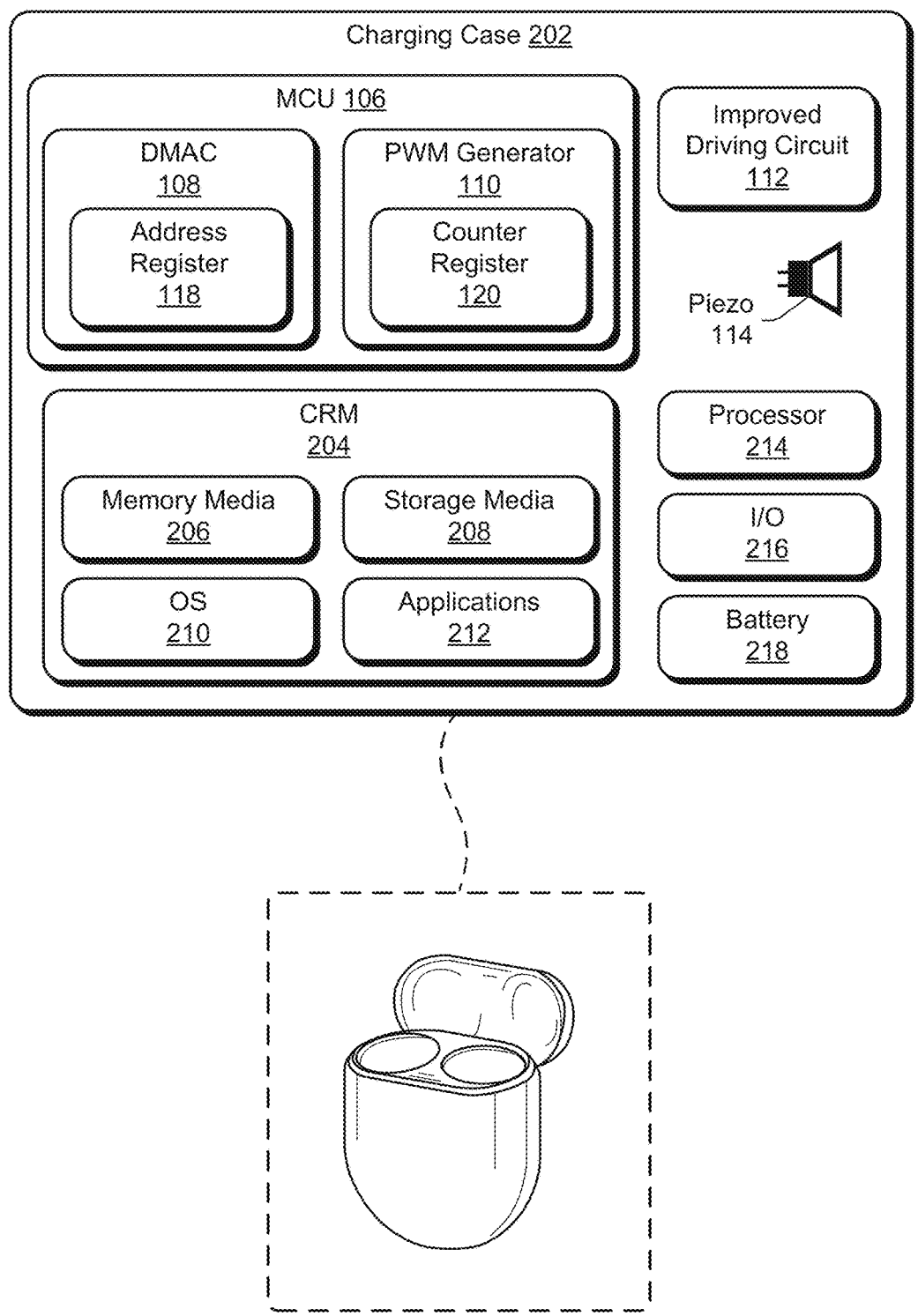
FIG. 2 illustrates an example implementation of a charging case in more detail.

FIG. 2 illustrates an example implementation 200 of a charging case 202 in detail. The charging case 202 is similar to the charging case 102 illustrated in FIG. 1 and described above, except as detailed below. Thus, the charging case 202 includes the MCU 106, the improved driving circuit 112, and the piezo 114. Further, the DMAC 108 includes the address register 118, and the PWM generator 110 includes the counter register 120.

The charging case 202 further includes CRM 204, which is similar to the CRM 116 illustrated in FIG. 1 and described above, except as detailed below. The CRM 204 includes memory media 206 and storage media 208. The memory media 206 may include one or more transitory (e.g., not permanent, volatile) storage devices, including random-access memory (RAM) and dynamic RAM (DRAM). The storage media 208 may include one or more non-transitory (e.g., permanent, non-volatile) storage devices, including flash memory, solid-state drives (SSDs), tape memory, magnetic hard drive disks (HDDs), and the like. Additionally, the CRM 204 includes an operating system 210 (OS 210) and applications 212, which may be stored as computer-readable instructions in the memory media 206 and/or the storage media 208.

FIG. 2 further illustrates that the charging case 202 includes a processor 214, input/output 216 (I/O 216), and a battery 218. The processor 214 may be any appropriate single-core or multi-core processor, including a central processing unit (CPU), a graphics processing unit (GPU), an arithmetic logic unit (ALU), a reduced instruction set computer (RISC), an advanced RISC machine (ARM), an SOC, and so forth. The processor 214 can be realized as a single processor or multiple processors configured to work cooperatively. For example, two processors may be attached (e.g., by solder, by pressure) to a motherboard, or another appropriate PCB, and share a bus for facilitating communications between the two processors. The processor 214 may execute computer readable instructions (e.g., OS 210, applications 212) stored in the CRM 204 to provide some or all the functionalities described herein.

The I/O 216 may include a port (e.g., a universal serial bus (USB) port) for physically recharging the charging case 202. Additionally or alternatively, the I/O 216 may include a wireless charging coil for wirelessly recharging the charging case 202. The I/O 216 may also include a light-emitting diode (LED) output for indicating a charging status to users. For example, the LED may blink red when the battery 218 is low, blink yellow when the battery 218 is charging, and blink green when the battery 218 is full. The I/O 216 may further include a port for transferring data from an external component (e.g., a desktop computer) to the charging case 202 and/or the CRM 204 thereof. For example, the data port may be used to apply firmware or software updates to the charging case 202.

The battery 218 may be realized as an alkaline battery, a nickel metal hydride battery, a lithium-ion battery, and the like. The battery 218 may include a jelly roll structure of anode layers, cathode layers, electrolyte layers, and so forth. The battery 218 may be a rechargeable battery that is recharged via the I/O 216 (e.g., charging port, wireless charging coil) as described above. The battery 218 may charge a hearable device (not illustrated) associated with the charging case 202.

Figure 3:
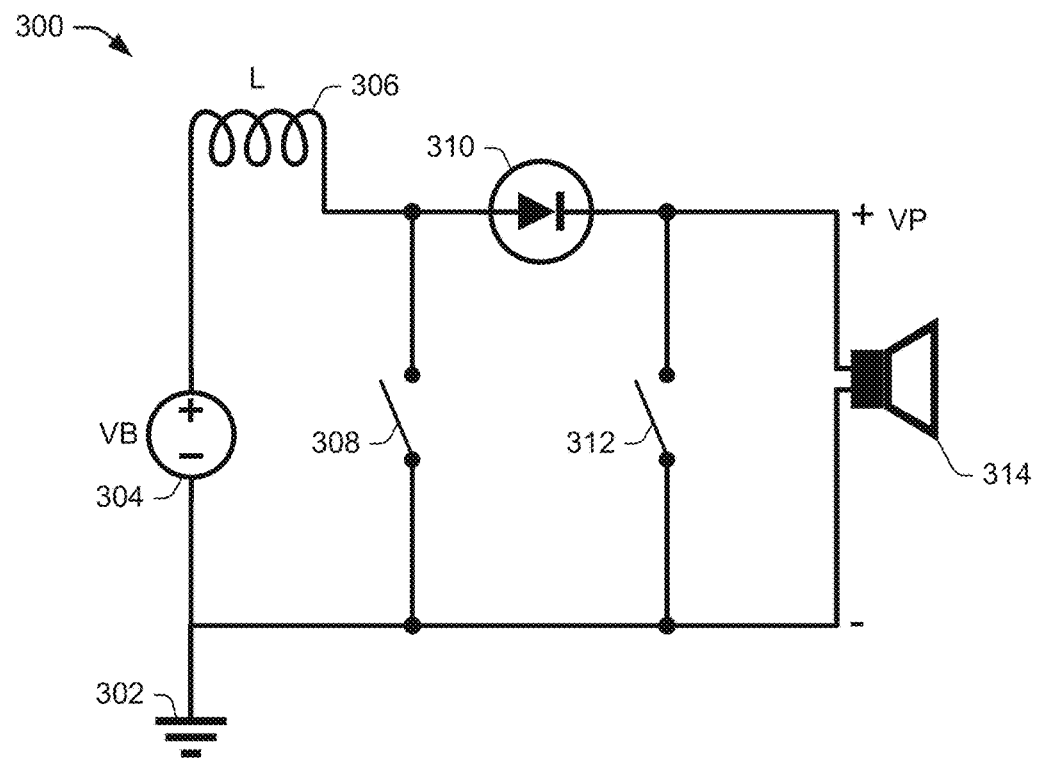
FIG. 3 illustrates a first example implementation of an improved driving circuit for a piezoelectric speaker.
Figure 3:
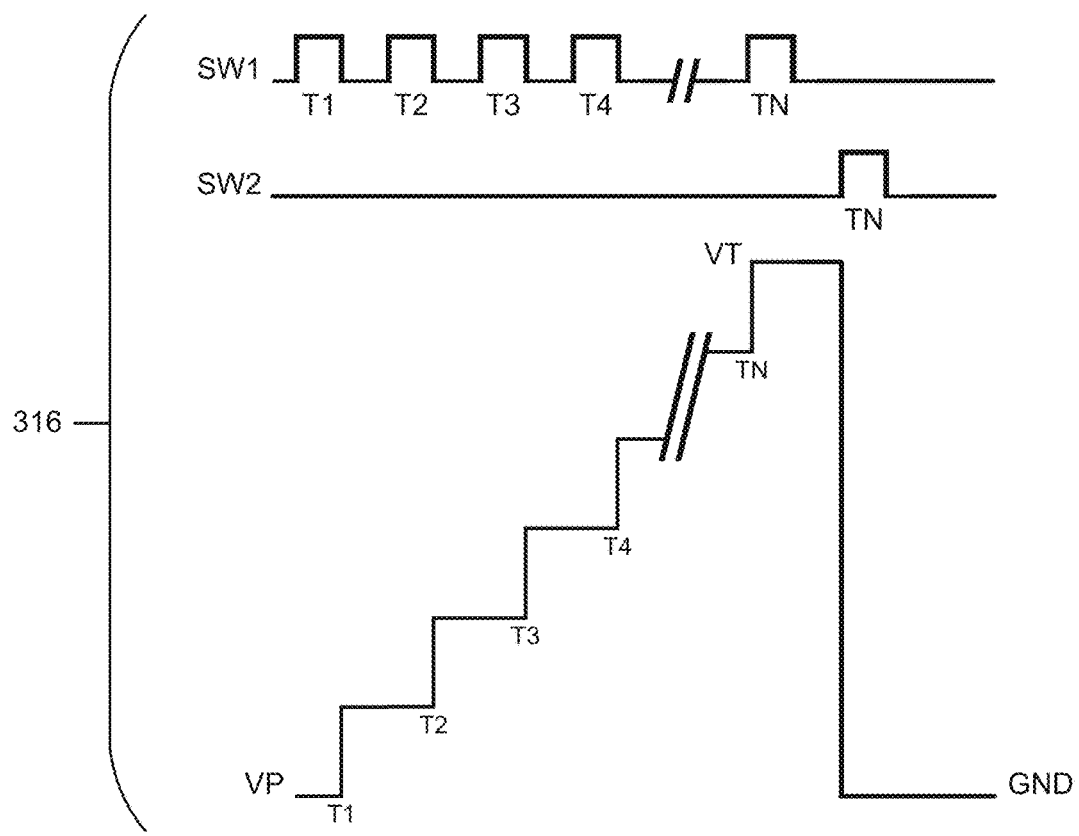

FIG. 3 illustrates a first example implementation of an improved driving circuit 300 (e.g., improved driving circuit 112 of FIGS. 1 and/or 2) for a piezoelectric speaker 314 (piezo 314) (e.g., piezo 114 of FIGS. 1 and/or 2). The improved driving circuit 300 is similar to the improved driving circuit 112 illustrated in FIGS. 1 and/or 2 and described above, except as detailed below. Thus, the improved driving circuit 300 may be included in a charging case (e.g., charging case 102 of FIG. 1, charging case 202 of FIG. 2) for a hearable device and provide improved battery life and audio quality. Further, the piezo 314 is similar to the piezo 114 illustrated in FIGS. 1 and/or 2 and described above, except as detailed below. Thus, the piezo 314 may be included in a charging case (e.g., charging case 102 of FIG. 1, charging case 202 of FIG. 2), be made of ceramic or quartz, and be circular in shape, having a diameter of 30 mm.

As illustrated, the improved driving circuit 300 includes a ground plane 302 (ground 302) connected in series with a DC voltage source 304 and an inductor 306. As illustrated, a negative terminal of the DC voltage source 304 is connected to the ground 302 and a positive terminal of the DC voltage source 304 is connected to the inductor 306. A first switch 308 is connected in parallel with the DC voltage source 304 and the inductor 306. An anode of a diode 310 is connected to the inductor 306 and the first switch 308. A second switch 312 and the piezo 314, which are connected in parallel, are connected between a cathode of the diode 310 and the ground 302.

The DC voltage source 304 may be realized as any appropriate DC voltage source (e.g., power brick, full wave bridge rectifier), but in this example, the DC voltage source 304 is a lithium-ion battery having a voltage in a range from 3 V to 8 V and labeled "VB." The inductor 306 may be any one of a variety of inductors, including air core inductors, iron core inductors, toroidal inductors, laminate core inductors, and so forth. A type of the inductor 306, like an inductance of the inductor 306, may depend on design considerations for the improved driving circuit 300. For example, the inductor 306 may include an inductance, labeled "L" in FIG. 3, in a range from 1.02 mH to 1.38 mH. The diode 310 may be any one of a variety of appropriate diodes, including constant current diodes, Zener diodes, Schottky diodes, rectifier diodes, and so forth, depending on the design considerations for the improved driving circuit 300. The diode 310 is configured to allow current flow from the anode connected to the inductor 306 and the first switch 308 to the cathode connected to the second switch 312 and the piezo 314.

The first switch 308 and the second switch 312 may be any appropriate switch, including an SCR, a TRIAC switching device, a BJT, a MOSFET, and the like. Further, the first switch 308 and/or the second switch 312 may include a peak current level of 400 milliamps (mA) to 800 mA and a breakdown voltage level of 120 V. Although not illustrated in FIG. 3, an MCU (e.g., MCU 106 of FIGS. 1 and/or 2) and/or a PWM generator (e.g., PWM generator 110 of FIG. 1) thereof may be connected to the first switch 308 and the second switch 312. The MCU may be configured to perform operations including toggling the first switch 308 and the second switch 312 in a manner that enables the improved driving circuit 300 to conserve power and improve audio quality (of the piezo 314). An example manner is illustrated in FIG. 3 at 316.

As illustrated, waveforms at 316 include a first waveform for the first switch 308 (SW1), a second waveform for the second switch 312 (SW2), and a third waveform for a voltage across the piezo 314 (VP). In FIG. 3, the first waveform and the second waveform represent a logic level input to SW1 and the SW2, respectively. That is, when the waveform (SW1 or SW2) is low, the corresponding switch (SW1 or SW2) is open (e.g., off), and when the waveform is high, the corresponding switch is closed (e.g., on). The third waveform represents the voltage VP across the piezo 314. For the first, second, and third waveforms, time progresses from left to right and includes time markers labeled "T1" through "TN."

FIG. 3 illustrates, at 316, that the MCU may first toggle SW1 for N number of times, where N is a positive integer greater than or equal to one. The MCU may first toggle SW1 at a frequency (e.g., defined in the sound file described with respect to FIG. 1) that is an integer division of a clock rate (e.g., 8 MHz, 12 MHz) of the MCU. For example, the MCU clock rate may be 10 MHz and the integer for the division may be in a range from one to 1,000. Accordingly, the MCU may first toggle SW1 at frequencies from 10 kHz (e.g., 10 MHz/1,000) to 10 MHz (e.g., 10 MHz/1). Thus, a period of the first toggling may be described by a difference between subsequent markers of time (e.g., T2−T1, TN−(TN−1)) and include a range from 0.1 microseconds (us) (e.g., $\frac{1}{10}$ MHz) to 100 us (e.g., $\frac{1}{10}$ kHz).

As illustrated, the MCU first toggles SW1 for N number of times, where a falling edge of each of the N toggles is indicated by one of the time markers T1 through TN. The third waveform representing the voltage VP across the piezo 314 rises corresponding to each of the falling edges indicated by the time markers T1 through TN. At TN, the VP reaches a target voltage level (VT) and, thus, the MCU and the improved driving circuit 300 are effective to charge the piezo to VT. The MCU may increase VT, and thus the sounding volume (e.g., sound intensity) of the piezo 314, through longer duty cycles or larger numbers of first toggles of SW1. The MCU may decrease VT through shorter duty cycles or smaller numbers of first toggles.

Responsive to first toggling SW1 N times to charge the piezo 314 to VT, the MCU may second toggle SW2, as illustrated at 316. The second toggling of SW2 to an on position (e.g., closed) is effective to discharge the piezo 314 from VT to a voltage level of the ground plane 302 (e.g., "GND," 0 V). The piezo 314 sounds when discharged, the volume of the sounding directly proportional to VT (e.g., larger VT for louder sounding). The MCU may repeat the second toggling of SW2 at a frequency in a range from 400 Hz to 6 kHz, for example, to sound the piezo 314 at the frequency. The MCU may include various combinations of duty cycles and numbers of times for the first toggling of SW1 with the second toggling of SW2 to produce soundings of various volumes and tones, improving audio quality of the piezo 314.

Figure 4:
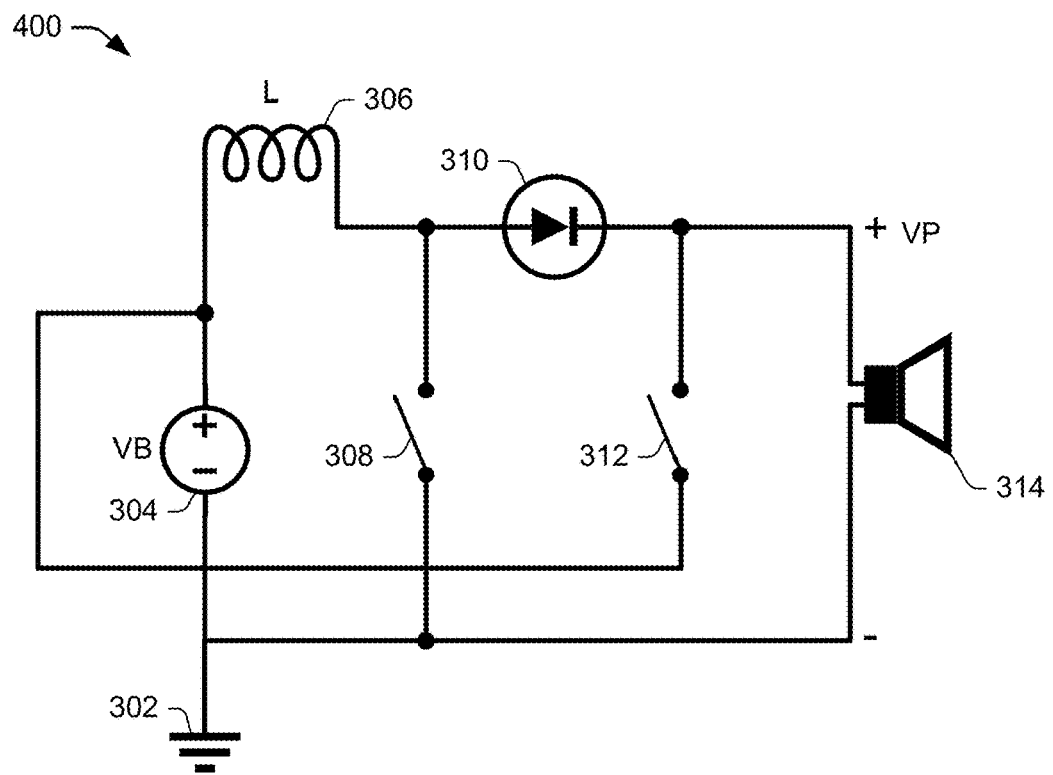
FIG. 4 illustrates a second example implementation of an improved driving circuit for a piezoelectric speaker.
Figure 4:
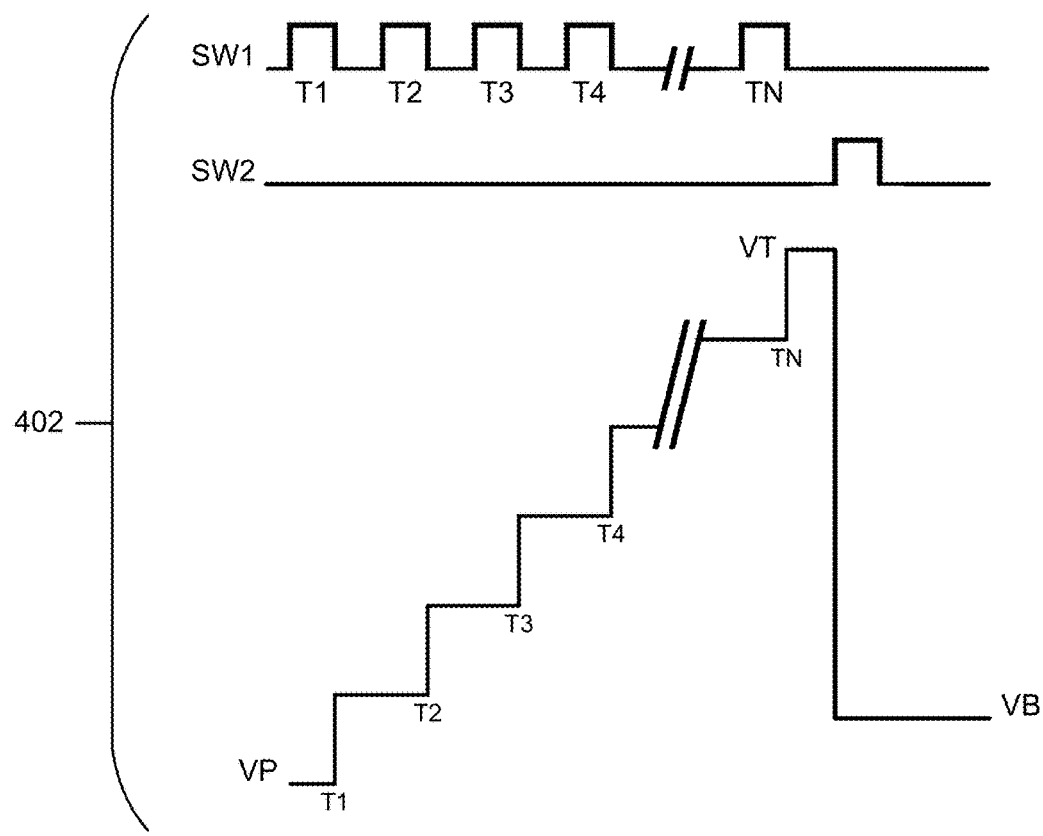

FIG. 4 illustrates a second example implementation of an improved driving circuit 400 for a piezoelectric speaker 314. As illustrated, the improved driving circuit 400 is similar to the improved driving circuit 300 illustrated in FIG. 3 and described above, except as detailed below. Accordingly, the improved driving circuit 400 includes the ground plane 302 (ground 302) connected to the negative terminal of the DC voltage source 304 and the positive terminal of the DC voltage source 304 connected to the inductor 306. The first switch 308 (SW1) is connected in parallel with the DC voltage source 304 and the inductor 306. The anode of the diode 310 is connected to the inductor 306 and the first switch 308. The cathode of the diode 310 is connected to the second switch 312 (SW2) and the piezo 314, which is also connected to the ground 302. Further, the improved driving circuit 400 may be included in a charging case (e.g., charging case 102 of FIGS. 1 and/or 2), which may be for a hearable device.

FIG. 4 also illustrates, at 402, waveforms associated with operations of the improved driving circuit 400. The waveforms are similar to those illustrated in FIG. 3 and described above, except as detailed below. Thus, an MCU (e.g., MCU 106 of FIGS. 1 and/or 2) is connected to the first switch 308 and the second switch 312 and configured to perform the operations of the improved driving circuit 400. The MCU performs operations including first toggling the first switch 308 for a number of times, illustrated by a first waveform (SW1) at 402, to charge the piezo 314 via the inductor 306 to VT. Responsive to the first toggling, the MCU second toggles the second switch 312, illustrated by a second waveform (SW2) at 402, to discharge the piezo 314. The MCU may perform operations illustrated by SW1 and SW2 waveforms of varying numbers of times, duty cycles, and frequencies to vary a volume and frequency of the piezo 314 when sounded.

The improved driving circuit 400 differs from the improved driving circuit 300 of FIG. 3 in that the second switch 312 is not connected between the cathode of the diode 310 and the ground 302. Rather, the second switch is connected between the cathode of the diode 310 and the positive terminal of the DC voltage source 304. This difference is highlighted in a third waveform (VP) at 402. Responsive to a falling edge of the second toggling of SW2, the piezo 314 is discharged from VT to a voltage of the DC voltage source 304 (VB). In implementations where the DC voltage source 304 is a lithium-ion battery, for example, the discharging of the piezo 314 at least partially recharges the lithium-ion battery. By so doing, the improved driving circuit 400 may improve a battery life of a charging case including the improved driving circuit 400. In turn, an associated hearable device that uses the charging case including the improved driving circuit 400 can also benefit from an improved battery life.

CONCLUSION

Although concepts of techniques and apparatuses directed to improved driving circuits for piezoelectric speakers have been described in language specific to techniques and/or apparatuses, it is to be understood that the subject of the appended claims is not necessarily limited to the specific techniques or apparatuses described. Rather, the specific techniques and apparatuses are disclosed as example implementations of improved driving circuits for piezoelectric speakers.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A circuit for driving a piezoelectric speaker comprising:
a ground plane;
a direct current voltage source comprising a positive terminal and a negative terminal, the negative terminal connected to the ground plane;
an inductor connected to the positive terminal;
a first switch connected between the inductor and the ground plane;
a diode connected to the inductor and the first switch;
a second switch connected between the diode and the ground plane or the positive terminal of the direct current voltage source;

a piezoelectric speaker connected between the diode and the ground plane; and a microcontroller unit connected to the first switch and the second switch, the microcontroller unit configured to perform operations comprising:

first toggling the first switch for a number of times, the first toggling to charge the piezoelectric speaker via the inductor to a target voltage level; and second toggling, responsive to first toggling the first switch for the number of times, the second switch, the second toggling to discharge the piezoelectric speaker from the target voltage level to a voltage level of the ground plane or the positive terminal of the direct current voltage source, respectively, the discharging to sound the piezoelectric speaker.

2. The circuit of claim 1, wherein the inductor is in a range from 1.02 millihenries to 1.38 millihenries.

3. The circuit of claim 1, wherein the target voltage level is in a range from five volts to 40 volts.

4. The circuit of claim 1, wherein the first toggling occurs at an integer division of a frequency from eight megahertz to 12 megahertz.

5. The circuit of claim 1, wherein the second toggling occurs at a frequency from 400 hertz to six kilohertz.

6. The circuit of claim 1, wherein the second switch connected between the diode and the ground plane or the positive terminal of the direct current voltage source is connected to the positive terminal of the direct current voltage source.

7. The circuit of claim 6, wherein:

the direct current voltage source is a lithium ion battery; and discharging the inductor and the piezoelectric speaker from the target voltage level to the voltage level of the positive terminal of the lithium ion battery is configured to recharge the lithium ion battery at least partially.

8. The circuit of claim 1, wherein the microcontroller unit operates at a clock rate from eight megahertz to 12 megahertz.

9. The circuit of claim 1, wherein the first switch and the second switch comprise:

a peak current level of 600 milliamps;

a breakdown voltage level of 120 volts; and at least one of:

a bipolar junction transistor; or a metal oxide semiconductor field effect transistor.

* * * * *